United States Patent [19]
Brändle et al.

[11] Patent Number: 5,136,235
[45] Date of Patent: Aug. 4, 1992

[54] RUGGED FIBER-OPTICAL CURRENT SENSOR BASED ON THE FARADAY EFFECT

[75] Inventors: Hubert Brändle, Otelfingen; Roland Stierlin, Gränichen, both of Switzerland

[73] Assignee: Asea Brown Boveri Ltd., Baden, Switzerland

[21] Appl. No.: 619,432

[22] Filed: Nov. 29, 1990

[30] Foreign Application Priority Data

Dec. 1, 1989 [CH] Switzerland .............. 4279/89

[51] Int. Cl.$^5$ .............. G01R 33/032; H01J 5/16
[52] U.S. Cl. .................. 324/96; 324/117 R; 324/244.1; 250/227.17; 356/351
[58] Field of Search .......... 324/117 R, 96, 244, 324/260, 244.1; 250/225, 227, 227.17; 332/7.51; 356/351, 368; 350/356, 374, 376; 455/610, 612

[56] References Cited

U.S. PATENT DOCUMENTS

| | | | |
|---|---|---|---|
| 3,502,978 | 3/1970 | Bernard et al. | 324/96 |
| 4,442,350 | 4/1984 | Rashleigh | 324/96 |
| 4,560,867 | 12/1985 | Papuchon et al. | 324/96 |
| 4,797,607 | 1/1989 | Dupraz | 324/96 |
| 4,947,107 | 8/1990 | Doerfler et al. | 324/96 |
| 4,973,899 | 11/1990 | Jones et al. | 324/96 |
| 5,051,577 | 9/1991 | Lutz et al. | 324/96 |

FOREIGN PATENT DOCUMENTS

| | | |
|---|---|---|
| 0072292 | 2/1983 | European Pat. Off. . |
| 2924804 | 1/1981 | Fed. Rep. of Germany . |
| 3115433 | 11/1982 | Fed. Rep. of Germany . |
| 2485204 | 12/1981 | France . |
| 2104213 | 3/1983 | United Kingdom .......... 324/96 |

OTHER PUBLICATIONS

IEE Proceedings, vol. 135, No. 5, Oct. 1988, pp. 372-383, S. Donati, et al., "Magneto-Optical Fibre Sensors for Electrical Industry:Analysis of Performances".

IEEE Journal of Quantum Electronics, vol. QE-18, No. 4, Apr. 1982, pp. 477-488, D. N. Payne, et al., "Development of Low- and High-Birefringence Optical Fibers".

Optical and Quantum Electronics 16 (1984), pp. 455-461, J. N. Ross, "The Rotation of the Polarization in Low Birefringence Monomode Optical Fibres Due to Geometric Effects".

Electronics Letters, Oct. 9, 1986, vol. 22, No. 21, pp. 1142-1144, L. Li, et al., "Current Sensors Using Highly Birefringent Bow-Tie Fibres".

Applied Physics, vol 28, No. 11, Jun. 1, 1989, pp. 2012-2016, K. Kawano, et al., "Efficient Highly Stable Laser Diode Module for Single-Mode Fiber Employing a Combination of Hemispherical Ended Grin Rod Lens and Virtual Fiber".

*Primary Examiner*—Vinh Nguyen
*Attorney, Agent, or Firm*—Oblon, Spivak, McClelland, Maier & Neustadt

[57] ABSTRACT

A fiber-optical current transformer including a sensor coil, operated in reflection mode, with a sensor fiber (5) for detecting a current utilizing of the Faraday effect. A light source (1) couples light into an incoming first HB fiber (2a). At the end of the first HB fiber (2a), a fiber-optical polarizer (4) is preferably located which ensures a direction of polarization in parallel with a given birefringence axis of the first HB fiber (2a). A Y splitter (3) couples, on the one hand, the supplied light of the first HB fiber (2a) into the sensor fiber (5) and, on the other hand, the light coming from the sensor fiber (5) into an outgoing second HB fiber (2b). The second HB fiber (2b) is rotated with its birefringence axes by 45° with respect to the birefringence axes of the first HB fiber (2a).

9 Claims, 1 Drawing Sheet

RUGGED FIBER-OPTICAL CURRENT SENSOR BASED ON THE FARADAY EFFECT

BACKGROUND OF THE INVENTION

1. Field of the Invention

The invention relates to a fiber-optical current transformer, comprising a) a sensor coil with a sensor fiber for detecting a current by means of the Faraday effect, b) a light source for generating light, c) fiber-optical means for supplying and removing light, d) means for polarizing the supplied light, e) a Y splitter at one input end of the sensor fiber, f) a mirror at a remote end of the sensor fiber, and g) means for detecting a magneto-optically induced rotation of the direction of polarization of the light.

2. Discussion of Background

Compared with conventional measuring devices, fiber-optical sensors have considerable advantages in conjunction with electrical power applications because of their known characteristics (passive sensors, inherent direct-current isolation, non-invasive measuring probes, low weight, low requirement for space, simple integration into digital system supervision). Various prototypes are known from the literature. A more recent analysis of integrated magneto-optical sensors is supplied, for example, by the article "Magneto-optical fibre sensors for electrical industry: Analysis and performances", S. Donati, V. Annovazzi-Lodi, T. Tambosso, IEEE Proc. Vol. 135, Pt. J. No. 5, Oct. 1988, pages 372-383.

A passive fiber-optical current transformer of the type initially mentioned is known, for example, from DE 31 15 433 Al. This current transformer makes use of the Faraday effect which induces a circular birefringence in a sensor fiber. In this arrangement, the sensor fiber is carried around the current conductor in several windings. It is heavily twisted around its longitudinal axis so that the curvature-induced and the linear internal birefringence of the fiber are suppressed. The sensor fiber is operated in reflection mode. At its input end, a Y splitter having one arm each for coupling linearly polarized light in and out is located. The detection is polarimetric.

The principle of polarimetric detection is known, for example, from the publication FR 2.485.204.

The sensor coil assumes a central position in the said current transformer. It can be implemented in various manners. In each case, it is basically a matter of suppressing unwanted birefringence effects in favor of the Faraday effect. The manner in which this aim can be achieved is known, for example, from the articles "Development of low- and high-birefringence optical fibers", D. A. Payne et al., IEEE J. of Quant. Electronics, QE-18 (1982), pages 477-488, "The rotation of the polarization in lowbirefringence optical monomode fibers due to geometrical effects", J. N. Ross, Optical and Quantum Electronics 16 (1984), pages 455-461, "Current sensors using highly birefringent bow-tie fibers", L. Li et al., Electronics Lett. 22 (1986), pages 1142-1144.

Although the directions of the approaches for implementing the fiber-optical sensors are predetermined, it is still unclear how long-time stability, operational reliability and high measuring accuracy can be ensured in the real application, that is to say under the actual, frequently rough environmental conditions (for example in a power distribution center). Especially mechanical effects (vibrations) and temperature changes can cause considerable disturbances depending on the structure of the current transformer.

It is basically desirable to use as few individual elements as possible. From this point of view, it is therefore of significance that laser diode modules have already been developed (see, for example, "Efficient highly stable laser diode module for single mode fiber employing a combination of hemispherical ended GRIN rod lens and virtual fiber", K. Kawano et al., applied optics, Vol. 28 No. 11, 1 Jun. 1989, pages 2012-2016), which are attached directly to one end of a single mode fiber (SMF) and are correspondingly distinguished by a good coupling efficiency, mechanical ruggedness and low costs.

SUMMARY OF THE INVENTION

Accordingly, one object of this invention is to provide a novel fiber-optical current transformer of the type initially mentioned, which avoids the problems existing in the prior art and is suitable for application under rough environmental conditions.

According to the invention, the solution consists in that in a current transformer of the type mentioned a first HB fiber is provided between light source and Y splitter for supplying, a second HB fiber is provided between Y splitter and the means for detecting for removing, the second HB fiber being rotated with its birefringence axes by 45° with respect to the birefringence axes of the first HB fiber, and means for polarizing the light in parallel with one birefringence axis predetermined by the first HB fiber are provided at the end of the first HB fiber in front of or in the actual Y splitter.

The advantages of the invention are the simple optical structure and the insensitivity to temperature and vibrational influences. This is because the device according to the invention does not require any novel components but can be implemented by means of commercially available components. In addition, the number of optical elements has been kept down. This is of importance because each junction of components results in a reduction in signal quality and additionally increases the production expenditure.

The separate supplying and removing of the light to and from the sensor in highly birefringent glass fibers, briefly called HB fibers (HB=high birefringence), makes an important contribution to the ruggedness of the current transformer. In this arrangement, the 45° orientation of the outgoing HB fiber with respect to the birefringence axes of the incoming HB fiber is a significant aspect.

The 45° orientation according to the invention makes it possible to fully utilize the advantages of polarimetric detection (particularly its simple structure and its accuracy) and, at the same time, locally to separate the sensor coil from the detection. This is of particular significance in the case of current measurements on overhead lines, for example. The 45° orientation in conjunction with the birefringent property of the (outgoing) fiber and the following Woolastone prism, the axes of which are aligned to the birefringence axes of the second HB fiber, has the same function, in principle, as a polarimetric detection directly at the end of the sensor fiber.

A central element of the arrangement according to the invention is the Y splitter. It should either be free of birefringence or have a length which, due to the existing birefringence, leads to an optical delay of exactly 180° or an integral multiple thereof, respectively.

The Y splitter preferably consists of a glass substrate into which suitable Y-shaped waveguide tracks are fused. Such a Y splitter can also be used in the polarimetric detector for splitting the polarization modes of the outgoing HB fiber. In this arrangement, the polarization modes are analyzed by two polarizers, which are aligned orthogonally with respect to one another, at the arms of the Y splitter and are then detected by photodiodes.

Such an embodiment has the advantage that no open beam paths occur (as, for example, when a Wollastone prism or a beam splitter is used). This results not only in high integration but also in good mechanical ruggedness. When the optical part of a current transformer according to the invention is constructed, the problems are essentially reduced to splicing glass fibers.

According to a preferred embodiment of the invention, the spectral band width of the light source is of such a magnitude that the coherence length of the light is of the order of 100 µm. The result of this is that unwanted crosscoupling of the polarization states in the HB fibers is low.

The light sources preferred in the above sense include, in particular, light-emitting diodes (LEDs or SRDs) but also laser diodes (LDs) having several axial modes. They have spectral band widths in the preferred range of 5-50 nm.

If a rotating mirror is arranged at the remote end of the sensor fiber, the interfering influences can be reduced which can occur, for example, by fixing the twisted sensor fiber in location. A rotating mirror is formed, for example, by a Faraday rotator arranged between the remote end of the sensor fiber and the mirror, which produces a total rotation of the direction of polarization by 90°.

A rotating mirror preferably comprises an optical glass which is accommodated in a permanent magnet, and optics (for example a collector lens) for collimating the light passing from the sensor fiber into the optical glass. The optical glass is, for example, metal-coated directly at one end.

For optimizing the direction of polarization of the light which is coupled into the Y splitter, a polarizer is arranged at the end of the incoming HB fiber in front of the actual Y splitter. This is preferably formed by an end of the HB fiber looped in a manner known per se to form a fiber-optical polarizer or by an integrated optical polarizer in one arm of the Y splitter. This avoids additional separate components.

According to an advantageous embodiment, the light source is a light-emitting or laser diode ("pigtail") bonded directly to the end of the incoming fiber. Such an embodiment is mechanically rugged and allows a high density of integration with few individual components.

The sensor coil is advantageously implemented as follows:
 winding a glass fiber with a high intrinsic circular birefringence (for example "HB-spun fiber") onto a hollow cylinder, or
 twisting and loosely winding a glass fiber with a low linear birefringence onto a hollow cylinder, or
 winding on a glass fiber in which the light is conducted along a helical line.

The Y splitter is preferably fixed in location on the hollow cylinder of the sensor coil, in such a manner that the sensor fiber extends in the tangential direction between wound-on section and Y splitter.

Further advantageous embodiments are obtained from the various possible combinations of the individual features.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
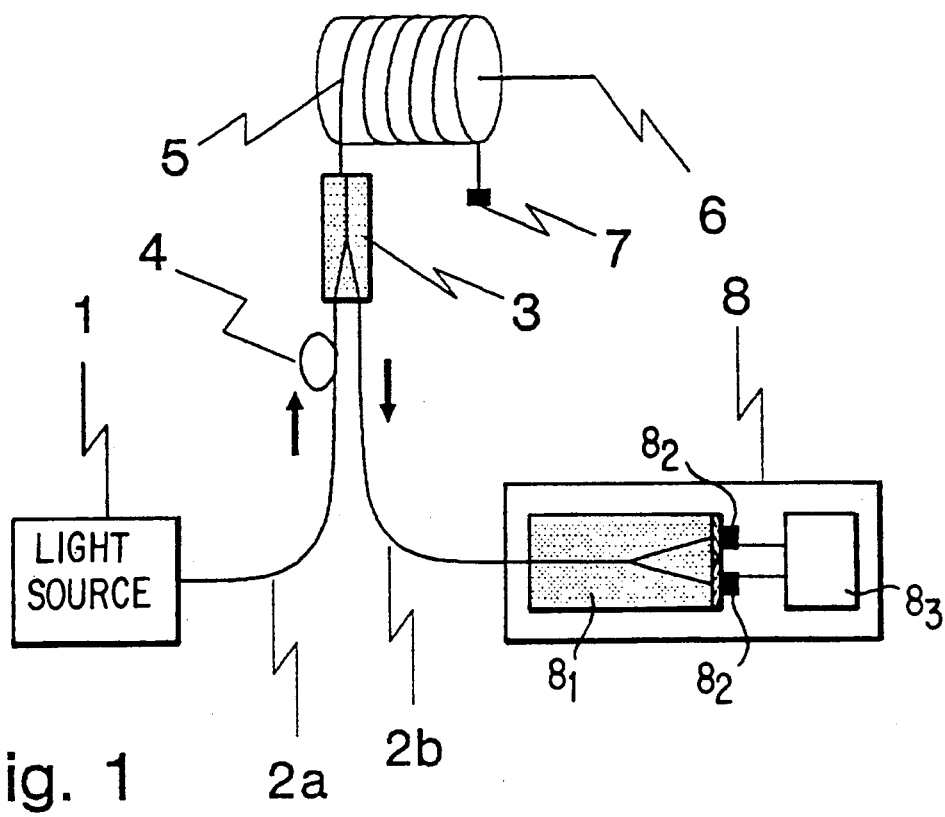
FIG. 1 shows a diagrammatic representation of a fiber-optical sensor.

Referring now to the drawings, wherein like reference numerals designate identical or corresponding parts throughout the several views, FIG. 1 diagrammatically shows a fiber-optical current transformer. A light source 1 is directly connected to a first HB fiber 2a.

According to a preferred embodiment, the light source 1 is a light-emitting diode of the type of a conventional LED, a superluminescent diode (see, for example, in the article by S. Donati et al. quoted) or a multi-mode laser diode. The LED, SRD or LD, respectively, is in each case bonded directly to one end of the first HB fiber 2a ("pigtail"). To obtain optimum coupling, the radiant surface of the light-emitting diode should have a distance of, for example, no more than about 10-20 µm from the HB fiber 2a or be imaged onto the fiber end via a lens system. Details can be found, for example, in the article by K. Kawano, already quoted.

Both LED and superluminescent diode, briefly called SRD, have a wide spectral band width which is desirable in the context of the invention. This is because the wide spectral band width results in a desired short coherence length. This largely suppresses crosstalk of the polarization states in the HB fiber.

The coherence length is preferably less than 1 mm. It is typically of the order of magnitude of about 100 m. A range of 5-50 nm is considered to be desirable with respect to the spectral band width.

The HB fiber 2a leads to an ideally optically isotropic Y splitter 3. Closely in front of it, the HB fiber 2a has a fiber-optical polarizer 4 in accordance with a preferred embodiment. This is formed in familiar manner by the fact that the end of the HB fiber 2a is wound into a tight loop with a particular radius. The polarizer 4 ensures that the direction of polarization of the light coupled into the Y splitter (or into the subsequent sensor fiber, respectively) is accurately defined and free of transmission-related mixing states.

The Y splitter 3 has three light-conducting arms. Via a first arm, light is supplied in from the first HB fiber 2a. An opposite second arm forms the input or output, respectively, to or from, respectively, a sensor fiber 5. A remaining third arm, which is opposite to the second arm and is next to the first one is coupled to an outgoing second HB fiber 2b.

A central property of the Y splitter is its freedom from birefringence or at least its low birefringence. In the case of optical isotropy (absence of birefringence), the state of polarization from the first HB fiber 2a is delivered undisturbed to the sensor fiber 5.

If there is slight birefringence, a slight temperature-dependent disturbance of the states of polarization is obtained which impairs the accuracy of measurement. In this case, a length adaptation of the Y splitter has the result that the optical delay (phase difference) is exactly 180° (or an integral multiple thereof). This maintains a linear input polarization state. During the passage through the Y splitter, it is therefore only the direction of the linear polarization which is rotated.

If the Y splitter 3 is birefringent, its axes must be aligned with the birefringence axes of the incoming first HB fiber.

The Y splitter 3 is preferably constructed to be optically integrated in that, for example, the index of refraction is selectively lowered by ion exchange in a suitable glass substrate so that flat branching Y-shaped waveguide tracks are produced.

Alternatively, a fiber-optical directional coupler (which may be weakly birefringent) can also be used. An integrated optical Y splitter is to be preferred, however, because it renders the device according to the invention overall less susceptible to interference.

In the case of an integrated optical Y splitter, the means for polarization can preferably also be constructed in an integrated optical manner, that is to say on a common substrate with the Y splitter, and then replace the fiber-optical polarizer 4. In the embodiment according to FIG. 1, the first arm of the Y splitter would be constructed to be polarizing. Naturally, the direction of polarization and the axes of birefringence of the first HB fiber would have to be aligned with one another in this arrangement.

The actual measurement transducer is formed by a sensor coil which comprises as the most essential element a sensor fiber which will be explained in the text which follows.

The sensor fiber 5 already mentioned extends, for example in several windings, around a current conductor 6 (for example an electrical overhead line). At a remote end of the sensor fiber 5, a mirror 7 is arranged. This means quite generally some suitable means which reflect back the light coming to the remote end of the sensor fiber 5. This particularly includes dielectric or metallic coatings on the fiber end.

The reflected light which then emerges from the input end of the sensor fiber 5 is transmitted by the Y splitter 3 to the outgoing second HB fiber 2b and finally delivered to a subsequent polarimetric detector 8.

The polarimetric detector 8 operates in a manner known per se. It detects the intensities $I_1$ and $I_2$ of the two modes of polarization of the second HB fiber 2b and determines from the ratio $(I_1 - I_2)/(I_1 + I_2)$ the electrical current flowing in the current conductor 6.

In the polarimetric detector 8, a Y splitter $8_1$ in conjunction with two polarizers $8_2$ aligned perpendicularly with respect to one another is preferably used, which polarizers analyze one state of polarization each of the second HB fiber at the outputs of the arms and produce outputs applied to detector $8_3$. With respect to the birefringence, the same applies which has already been said above with respect to the Y splitter $8_1$. In the case of birefringence, the Y splitter of the detector must be aligned with the birefringence axes of the second HB fiber.

The second HB fiber 2b is connected to the Y splitter 3 in a quite particular manner, that is to say with a well-defined orientation. This will be explained with reference to FIG. 2 in the text which follows.

Figure 2:
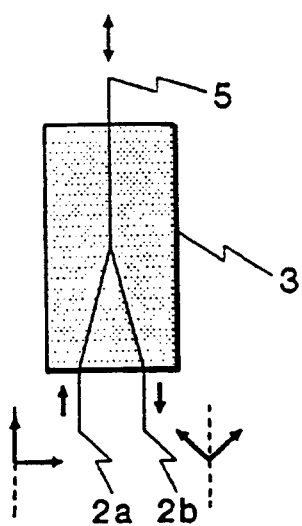
FIG. 2 shows a diagrammatic representation of a Y splitter.

It is known that a HB fiber can be associated with an orthogonal system of coordinates having two axes. In this context, the said axes correspond to the birefringence axes of the HB fiber. In FIG. 2, these systems of coordinates are indicated for the two HB fibers 2a and 2b. According to the invention, the system of coordinates of the second HB fiber 2b is rotated by 45° compared with that of the first HB fiber 2a. This has the following effect.

In the absence of an electrical current (idle state) the direction of polarization (indicated by a dashed line) of the light emerging from the first HB fiber 2a is parallel to one birefringence axis. After passage through the sensor fiber, that is to say when entering the outgoing second HB fiber 2b, the direction of polarization coincides with the bisecting line of the system of coordinates of this fiber.

In the presence of an alternating current in the current conductor 6 the direction of polarization periodically fluctuates about the bisecting line when entering into the second HB fiber 2b. In the second HB fiber, therefore, the intensity of the light is distributed in approximately equal proportions to the two states of polarization. This means maximum sensitivity for the subsequent polarimetric detection.

Next, the sensor coil will be discussed in greater detail. It is preferably formed by a sensor fiber 5 which is wound onto a suitable hollow cylinder, for example of plastic. In practice, several approaches are available for producing it.

The sensor fiber can be, for example, a glass fiber with high intrinsic circular birefringence (for example "HB-spun fiber"). It is wound loosely onto the hollow cylinder. This technique is known, for example, from the article by L. Li et al. initially quoted.

Another possibility consists of using a glass fiber having a low linear birefringence. In this connection, it is required first to twist the glass fibre mechanically and then to wind it onto the hollow cylinder. In this case, the sensor fiber must thus be fixed properly at both ends on the hollow cylinder so that the twisting is retained. This can entail disadvantages which, however, can be avoided with particular means still to be described. The principle of using a twisted glass fiber as a current transformer is known, for example, from patent specification DE 31 15 433 A1, already quoted.

A third variant is the use of a glass fiber in which the light is conducted along a helical line. The glass fiber is loosely wound onto the hollow cylinder. Such a technique is known, for example, from the article by J. N. Ross initially quoted.

Figure 3:
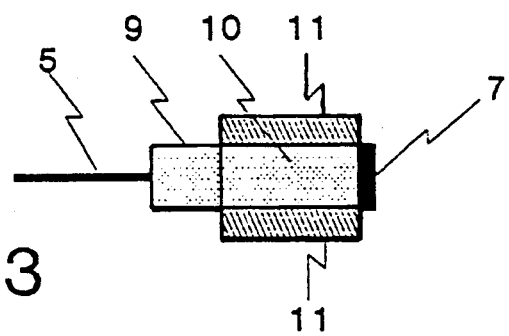
FIG. 3 shows a diagrammatic representation of a rotating mirror.

FIG. 3 shows an extension of the sensor coil which is of interest, particularly in conjunction with twisted glass fibers. This is the extension by a Faraday rotator which is arranged at the remote end of the sensor fiber 5 between fiber end and mirror 7.

The light emerging from the sensor fiber 5 at the remote end (from the perspective of the Y splitter 3) is collimated by means of suitable optics, for example a lens 9, and then passes through a cylindrical optical glass 10 in the axial direction. Behind the optical glass 10, the mirror 7 is located so that the light passes a second time through the optical glass 10 in the reverse direction and is coupled into the sensor fiber 5 again by the lens 9.

A permanent magnet 11 arranged on the outside of the optical glass 10 causes the direction of polarization of the light to be rotated by 90° after passing through twice (to and fro), using the magnetooptical effect. The advantage of this 90° rotation lies in the fact that induced birefringence which can be caused, for example, by the rigid fixing of the twisted glass fiber, can be largely eliminated.

Although the rotating mirror (for example Faraday rotator with a metal-coated end) is preferably used together with the twisted sensor fiber, this does not mean that it cannot also bring advantages in other types of embodiments of the sensor coil. Naturally, the Faraday rotator can also be constructed in a different manner as long as the 45° rotation per passage is ensured.

Figure 4:
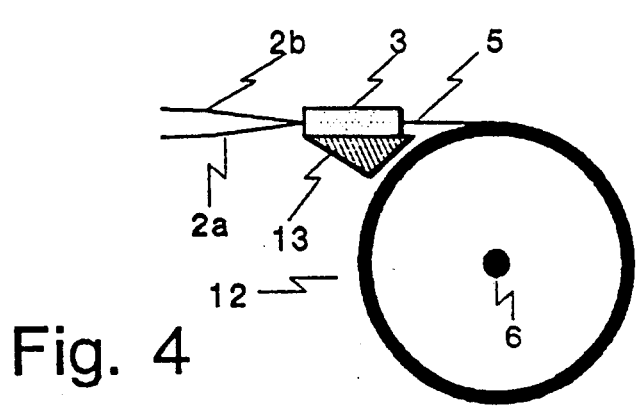
FIG. 4 shows a diagrammatic representation of a Y splitter attached to the sensor coil.

FIG. 4 shows a diagrammatic representation of a Y splitter 3 attached to the sensor coil. The sensor fiber 5 is wound onto a hollow cylinder 12 of plastic as described above. At the input end, it is connected to the second arm of the Y splitter 3. According to an advantageous embodiment, the Y splitter 3 is then attached to the sensor coil or more accurately to the hollow cylinder 12. In this arrangement, it is aligned in such a manner that the sensor fiber 5 tends to move away tangentially from the hollow cylinder and the light can pass through the Y splitter 3 along an unbroken line. The said condition can be ensured, for example, with the aid of a small wedge 13 between Y splitter 3 and hollow cylinder 12.

The essential features of the invention certainly include the supplying and removing of the light via HB fibers and their special connection to the Y splitter. In other respects, the individual aspects are accessible to many modifications. These are randomly available to the expert from the illustrative embodiments discussed.

As already indicated several times, the current transformer according to the invention is particularly well suited to current measurements on electrical overhead lines.

In some way, it can be stated that the invention specifies an approach for constructing fiberoptical current transformers for practical application in a rugged environment.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A fiber-optical current sensor for measuring by means of the Faraday effect a current flowing through a conductor, comprising:
   a light source for generating light;
   a sensor coil with a sensor fiber wound around said conductor, said sensor fiber having a first end and a second end;
   means for detecting a magneto-optically induced rotation of the direction of polarization of a light;
   a first Y splitter with an input arm and two output arms; said first Y splitter being connected with said input arm to said first end of said sensor fiber, said first Y splitter being either free of birefringence or having a length which, due to an existing birefringence, leads to an optical delay of exactly 180° or an integral multiple thereof, respectively;
   a mirror arranged at said second end of said sensor fiber;
   a first high-birefringence (HB) fiber conducting light from said light source to the first of said two output arms of said first Y splitter, said first HB fiber having a first pair of birefringence axes;
   a second high-birefringence (HB) fiber conducting light from the second of said output arms of said first Y splitter to said detecting means, said second HB fiber having a second pair of birefringence axes being rotated by 45° with respect to said first pair of birefringence axes; and
   means for polarizing light in parallel with one of said first pair of birefringence axes, said polarizing means being provided either between said first HB fiber and said first output arm of said first Y splitter or within said first output arm of said first Y splitter.

2. Fiber-optical current transformer as claimed in claim 1, wherein the light source has a spectral band width of between 5 and 50 nm.

3. Fiber-optical current transformer as claimed in claim 1, wherein at said second end of the sensor fiber said mirror is rotatable to rotate the direction of polarization of the light by a total of 90°.

4. Fiber-optical current transformer as claimed in claim 3, wherein the rotating mirror in the sense of a Faraday rotator comprises an optical glass which is accommodated in a permanent magnet and optics for collimating the light passing from the sensor fiber into the optical glass.

5. Fiber-optical current transformer as claimed in claim 1, wherein the Y splitter, together with the means for polarizing, is constructed to be optically integrated.

6. Fiber-optical current transformer as claimed in claim 1, wherein the means for polarizing comprise an end of the incoming first HB first looped to form a fiber-optical polarizer.

7. Fiber-optical current transformer according to claim 1, wherein the sensor coil is constructed in one of the three following types:
   a glass fiber with a high intrinsic circular birefringence is loosely wound onto a hollow cylinder, or
   a glass fiber with a low linear birefringence is mechanically twisted and loosely wound onto a hollow cylinder, or
   a glass fiber, in which the light is conducted along a helical line, is loosely wound onto a hollow cylinder.

8. Fiber-optical current tranformer as claimed in claim 1, wherein the light source is an LED, an SRD or an LD which is in each case bonded directly to the first HB fiber.

9. A fiber-optical current sensor as claimed in claim 1, wherein:
   said detecting means comprise a second Y splitter with an input arm and two output arms, said input arm of said second Y splitter being connected to said second HB fiber; and
   at the end of each of said output arms of said second Y splitter a linear polarizer and a subsequent detector are provided each, the polarizing axes of said polarizers being perpendicular to each other.

* * * * *